United States Patent
Zhang et al.

(10) Patent No.: US 8,569,889 B1
(45) Date of Patent: Oct. 29, 2013

(54) NANO THICK PT METALLIZATION LAYER

(75) Inventors: Shiguo Zhang, Camas, WA (US);
Sandrio Elim, Vancouver, WA (US);
Ling Bao, Vancouver, WA (US)

(73) Assignee: nLIGHT Photonics Corporation, Vancouver, WA (US)

( * ) Notice: Subject to any disclaimer, the term of this patent is extended or adjusted under 35 U.S.C. 154(b) by 276 days.

(21) Appl. No.: 13/024,219

(22) Filed: Feb. 9, 2011

(51) Int. Cl.
*H01L 23/485* (2006.01)

(52) U.S. Cl.
USPC .................. 257/753; 257/E23.017

(58) Field of Classification Search
None
See application file for complete search history.

(56) References Cited

U.S. PATENT DOCUMENTS

| 5,429,986 A | 7/1995 | Okada |
| 6,188,137 B1 | 2/2001 | Yagura |
| 7,270,884 B2 | 9/2007 | Lian |
| 2005/0211989 A1* | 9/2005 | Horio et al. ............ 257/79 |
| 2007/0145397 A1* | 6/2007 | DenBaars et al. ....... 257/98 |
| 2008/0315427 A1* | 12/2008 | Seko ..................... 257/772 |
| 2011/0049541 A1* | 3/2011 | Katsuno et al. ......... 257/94 |

* cited by examiner

*Primary Examiner* — Wensing Kuo
(74) *Attorney, Agent, or Firm* — Ethan A. McGrath

(57) ABSTRACT

A metallization layer for a semiconductor device includes a first layer made of Pt and having a thickness greater than or equal to 15 Å and less than or equal to 50 Å, and a second layer formed on the first layer and made of a plurality of metallic sub-layers such as Ti/Pt/Au. A semiconductor device fabricated from the metallization layer includes a semiconductor substrate having a top layer and mesa structure and corresponding surface for securing an insulating layer and a corresponding exposed surface, and wherein the metallization layer is deposited over the insulating layer and exposed surface. Methods for forming the metallization layer are also disclosed.

9 Claims, 5 Drawing Sheets

NANO THICK PT METALLIZATION LAYER

BACKGROUND OF THE INVENTION

1. Field of the Invention

Generally, the field of the present invention is adhesion bonding with semiconductors. More particularly, the present invention relates to the adhesion of metallic layers to p-type III-V compound semiconductors.

2. Background Art

In order to enhance the performance of semiconductors, advances have been made in types of materials used and methods for forming those materials. One such area of performance pertains to the formation and structure of metal and semiconductor contact. For semiconductor lasers, this contact should be ohmic, that is, the contact should exhibit linear I-V characteristics, and a low contact resistance is required. U.S. Pat. No. 5,429,986 describes a process for forming a low resistance ohmic contact electrode that has a layer of Pt interposed between a p-type GaAs layer and a Ti/Pt/Au layer wherein the interposed Pt layer has a thickness greater than 50 Å and less than 400 Å. The '986 also extrapolates that for thicknesses less than 50 Å, unsuitable contact resistances are obtained.

However, in addition to contact resistance, other characteristics are desirable for contacts formed on p-type semiconductors. For example, the time required to complete the formation of a contact through annealing can impact the overall cost of manufacturing devices utilizing the contacts. Additionally, the adhesion strength between contact metals and underlying semiconductor and insulating layers can allow subsequent fabrication steps without metal peeling and can determine the infant mortality rate and useful life of devices incorporating the contacts. Thus, reliability remains important and concomitant attributes such as robustness and versatility can extend the scope of use of products fabricated with ohmic contacts.

Thus, despite the considerable efforts that have been exerted for many years, there remains a long felt need for a p-metal that provides superior strength, reliability, and processing time without any attendant drawbacks.

SUMMARY OF THE INVENTION

According to one aspect of the present invention, an adhesive layer joining opposing device layers of a semiconductor device includes a thin layer of Pt having a thickness greater than or equal to 15 Å and less than or equal to 50 Å.

According to another aspect of the present invention, a metallization layer for a semiconductor device includes a first layer made of Pt and having a thickness greater than or equal to 15 Å and less than or equal to 50 Å, and a second layer formed on the first layer and made of a plurality of metallic sub-layers, such as Ti/Pt/Au.

According to another aspect of the present invention, a semiconductor device includes a semiconductor substrate including a top layer having a surface, an insulating layer formed on a first portion of the surface and not formed on a second portion of the surface, a metallization layer deposited on the insulating layer and the second portion of the surface, wherein the metallization layer includes a first layer made of Pt and having a thickness greater than or equal to 15 Å and less than or equal to 50 Å and a second layer made of a plurality of metallic sub-layers.

According to another aspect of the present invention, a method includes forming a p-type semiconductor layer, and forming a metallization layer on the p-type semiconductor layer wherein the metallization layer includes a thin Pt layer having a thickness less than or equal to 50 Å and greater than or equal to 15 Å and a plurality of metallic layers on the thin Pt layer.

The foregoing and other objects, features, and advantages will become more apparent from the following detailed description, which proceeds with reference to the accompanying figures.

DETAILED DESCRIPTION OF THE INVENTION

Figure 1:
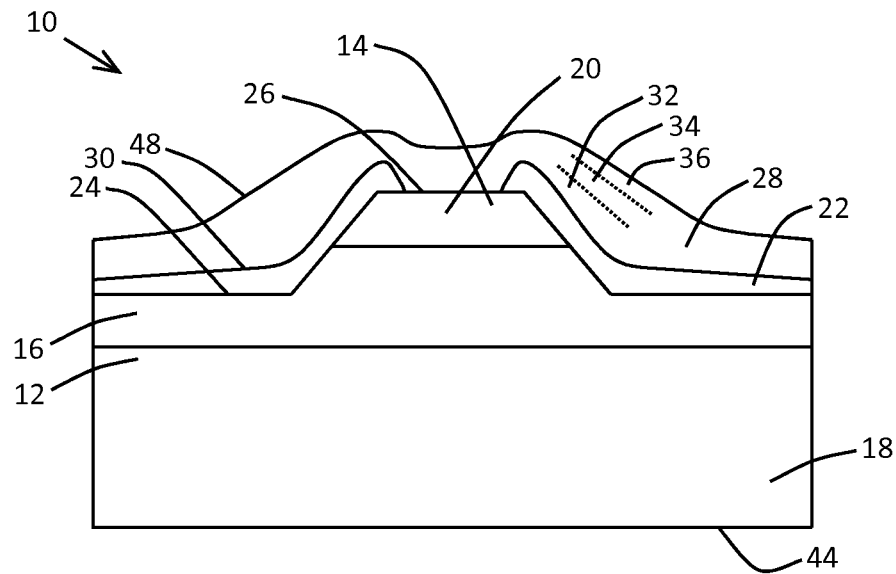
FIG. 1 is a cross-sectional view of a typical p-metal deposited on a p-type III-V compound semiconductor and forming an electrode.
Figure 2:
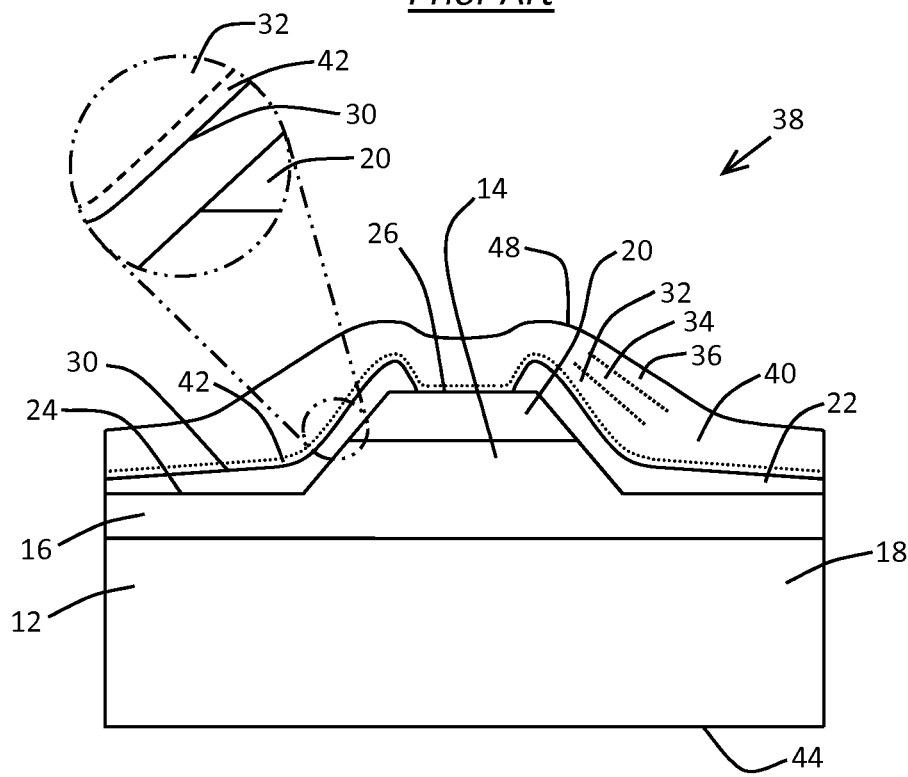
FIG. 2 is a cross-sectional view of an exemplary embodiment of the present invention showing an additional Pt layer at the p-type semiconductor interface, said additional Pt layer being shown in greater detail in an expanded bubble.

Referring now to FIG. 1, a semiconductor device structure 10 is shown that includes a semiconductor crystal 12 epitaxially grown and processed so as to form a mesa structure 14 from p-type semiconductor epi layers 16. The semiconductor 12 typically includes several p-type semiconductor layers 16 having varying compositions, including a surface layer 20 made of, for example, GaAs. Other surface layers may be used depending on the device made. For example, InGaAs surface layers can be used for InP based semiconductor devices. The various epi layers 16 are typically grown on an n-type substrate 18. The mesa structure 14 may be trapezoidal as shown in FIGS. 1 and 2 or it may have other shapes as suitable for different applications. A dielectric layer 22, such as silicon oxide or silicon nitride, is deposited on top semiconductor surface 24 and is selectively removed above a portion 26 of the surface 24 of top layer 20 on the mesa 14. A p-metal metallization layer 28 is applied to bare surface 26 of p-type layer 20 and surface 30 of silicon oxide layer 22. Typically, the p-metal 28 has three layers 32, 34, 36 comprised of Ti, Pt, and Au, respectively; however other p-metal layer combinations can also be used. The metal/semiconductor structure 10 is annealed in order to form a secure mechanical and electrical connection between the metallization layer 28 and the semiconductor surface and silicon oxide layers 20, 22. The structure 10 may undergo additional processing steps and may then become suitable for use in various applications, such as semiconductor lasers.

Referring to FIG. 2, in an exemplary embodiment of the present invention, a metal/semiconductor semiconductor device structure 38 is shown. Similar to structure 10, structure 38 includes a multi-layer p-metal 40, such as three layers 32, 34, and 36 made from Ti, Pt, and Au, respectively, a dielectric layer 22 such as silicon oxide or silicon nitride, as well as multiple semiconductor layers 16 epitaxially grown on an n-type substrate 18. The structure 38 also includes an additional thin Pt layer 42 formed between p-metal 40 and surfaces 26, of p-type semiconductor and silicon oxide layers 20, 22. Structure 38 may also take the form of a planar structure or depressed structure (not shown) as well. The layer 42 has a deposited thickness of 50 Å or less and causes the structure 38 to exhibit several superior characteristics over structures having layers of Pt with thicknesses larger than 50 Å or having no additional Pt layer (FIG. 1). More particularly, Pt layers 42 having a thickness of about 15-25 Å exhibit highly desirable characteristics overall.

Figure 3:
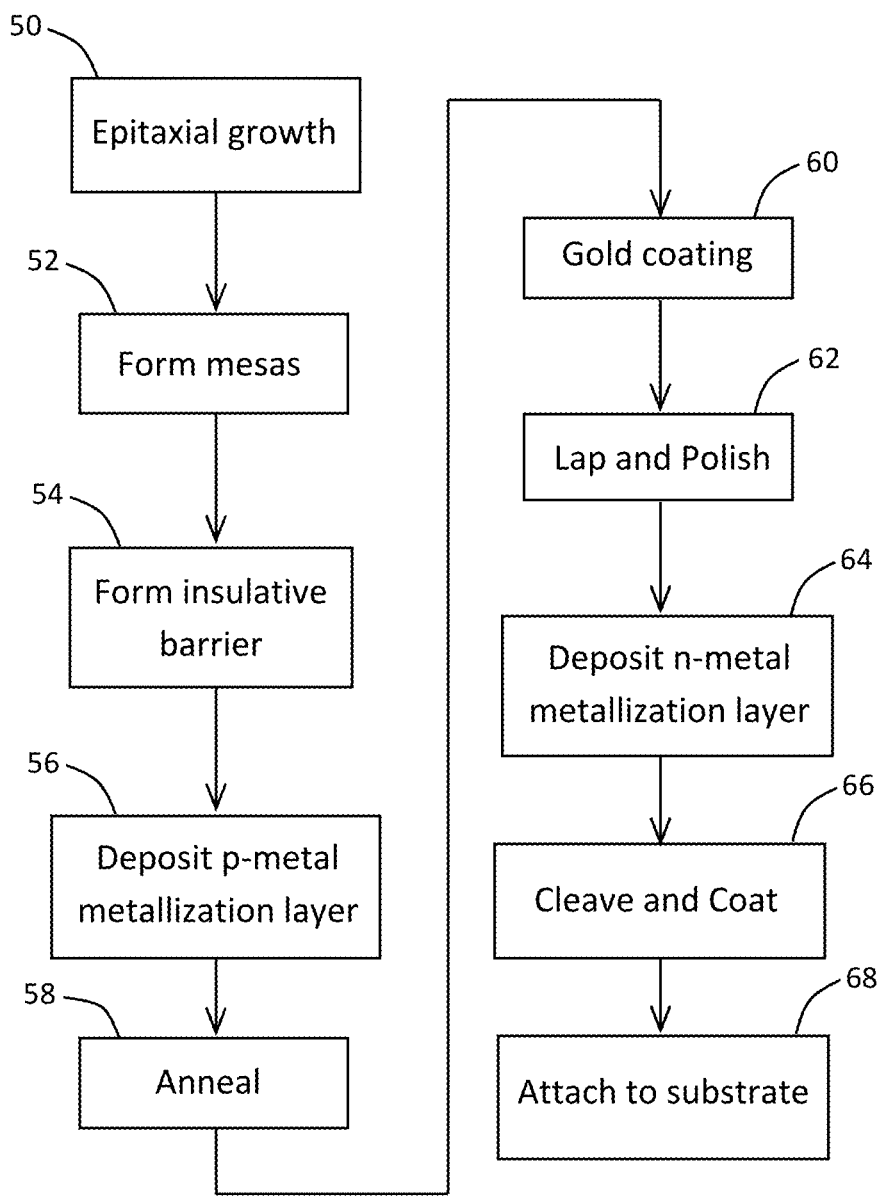
FIG. 3 is a flow-chart diagram showing typical processing steps for making a device using exemplary methods of the present invention.

Referring now to FIG. 3, typical processing steps for metal/semiconductor structures 10, 38 are shown including steps for methods of the present invention. Using various semiconductor growth techniques, such as metalorganic chemical vapor deposition (MOCVD), several semiconductor layers 16 are epitaxially grown, as per step 50, on a semiconductor substrate 18. The surface of the semiconductor is etched, as per step 52, through one or more layers 16 using suitable processing techniques such as lithography and acid-etching in order to form mesa structures 14. Silicon oxide 22 is deposited, as per step 54, on the surface 24 of the semiconductor to form an insulating barrier and then a contact portion 26 is exposed by removing the silicon oxide using lithography and acid etching or other suitable techniques. A metallization layer 40 is deposited, as per step 56, on surfaces 26, 30 of p-type and silicon oxide layers 20, 22 using conventional techniques, such as electron beam evaporation. However, as opposed to using a series of three layers Ti/Pt/Au or other suitable combination, a thin layer of Pt 42 is deposited first and other p-metal layers, such as Ti/Pt/Au, are deposited subsequently.

After depositing the Pt/Ti/Pt/Au p-type metallization layer 40, the metal/semiconductor structures are annealed, as per step 58, in order to form a low resistance ohmic contact and secure the layer 40 to the exposed contact surface 26 and the surface 30 of the insulating silicon oxide layer 22. In contradistinction to more commonly applied metallization layers requiring annealing times of approximately 20 minutes at a temperature of 400° C., the Pt/Ti/Pt/Au metallization layer 40 achieves superior adhesion and low resistance results when annealed at between 375 and 425° C. for only 1 minute. Thus, when warm-up and cool-down times of approximately five minutes each are included, the Pt/Ti/Pt/Au metallization layer 40 requires approximately two thirds less time in the annealing process than conventional Ti/Pt/Au metallization layers 28. The substantial reduction in annealing time results in significantly improved manufacturing throughput.

One result of the annealing process step 58 is the formation of an ohmic contact at exposed mesa surface 26. In order for the contact to be ohmic, the contact resistance must be low enough so as not to have a significant effect on the operation of the device and the I-V characteristics across the contact should be as linear and symmetric (positive and negative bias) as possible. After annealing the Pt/Ti/Pt/Au metallization layer, an ohmic contact is formed that exhibits linear and symmetric I-V characteristics and that exhibits contact resistances in a range between 0.7 and 2.7 $\mu\Omega\text{-cm}^2$. Such contact resistances are similar to those achieved for structures which do not have Pt layer 42, and more importantly, the contact resistances achieved are much smaller compared to the resistances associated with other portions of the package, such as across the p-n junction or substrate.

Figure 4:
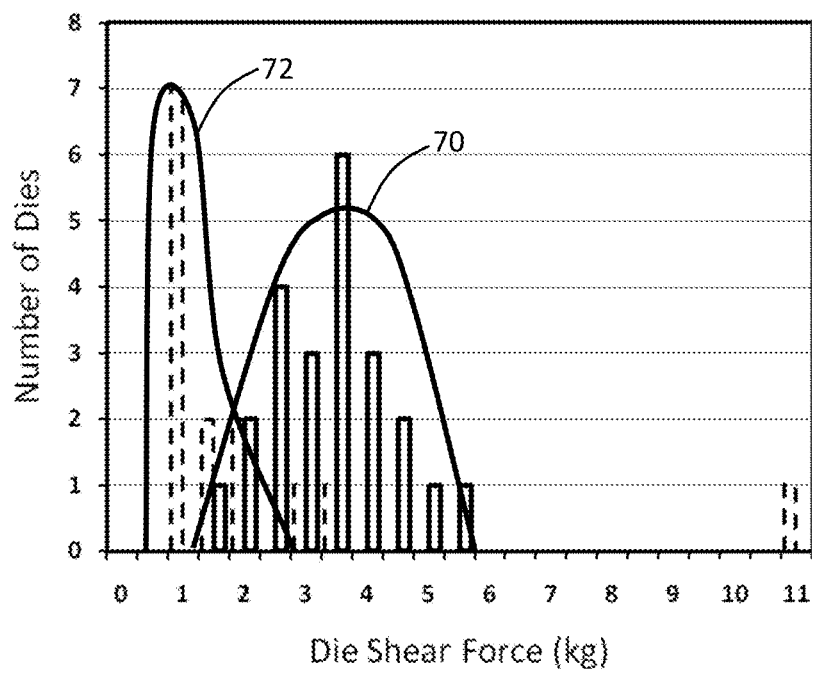
FIG. 4 is a chart showing the superior strength of an exemplary embodiment of the present invention.

The annealing process step 58 also results in an increased mechanical strength or adhesion between the metallization layer 40 and the layers of silicon oxide 22 and surface p-type semiconductor 20. As can be seen in FIG. 4, the die shear force strength curve 70 achieved by the metallization layer 40 using 20 Å samples is significantly higher, having approximately two times higher average strength, than the strength curve 72 of conventional layers 28, such as Ti/Pt/Au, which omit thin Pt layer 42. Additionally, the strength curve 70 for metallization layer 40 has a more Gaussian and symmetric shape, yielding more reliable strength behavior for semiconductor structures using layer 42 as well as devices that include those structures and processes that work with those structures.

Figure 5:
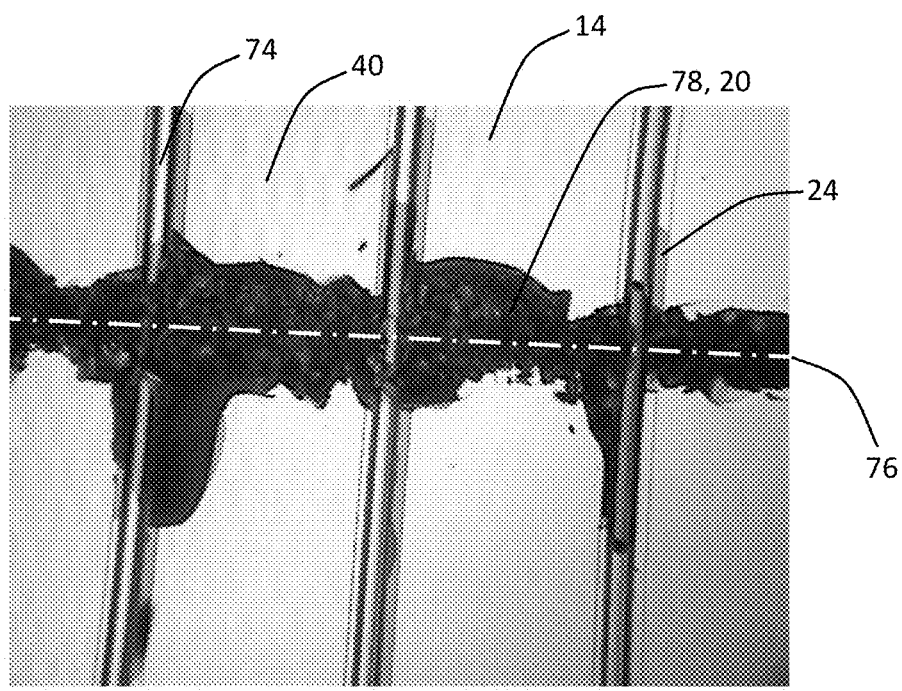
FIG. 5 is a plan view image of an embodiment of the present invention after destructive testing.
Figure 6:
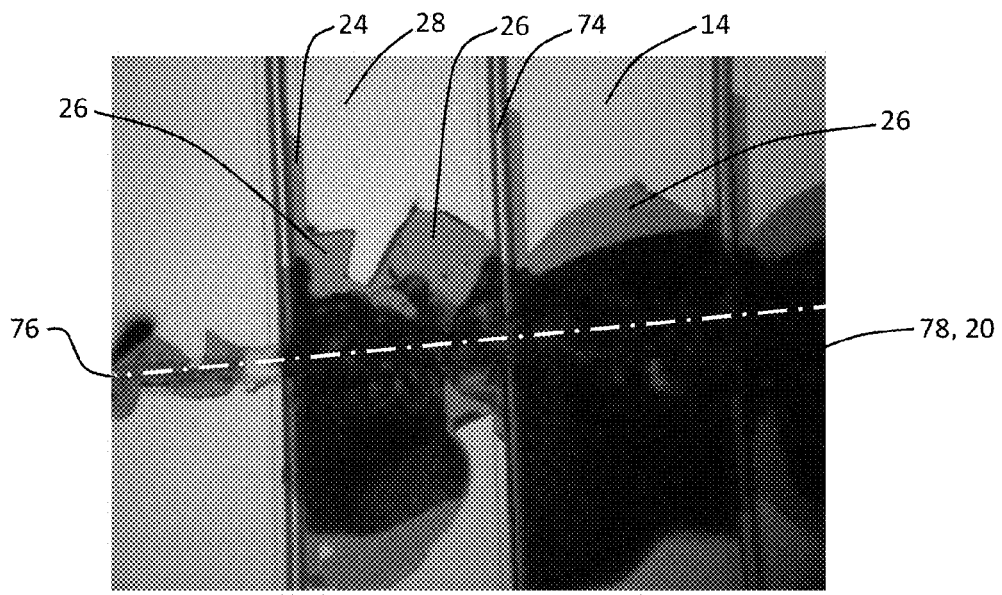
FIG. 6 is a plan view image of the remains of typical p-metal deposited on a p-type semiconductor after destructive testing.

Referring now to FIGS. 5-6, images are shown of p-type GaAs after destructive testing which further indicate the improved adhesion strength characteristics introduced by additional Pt layer 42. FIG. 5 shows a plan view of semiconductor mesa structures 14 separated by channels 74. A line 76 is scribed across the structures 14 that have a p-metal 40 deposited thereon and annealed. Tape is placed over top surface 48 and aggressively peeled away to cause damage to the deposited layers 40 and semiconductor structure. After peeling the tape, dark regions 78 are revealed that are underlying damaged GaAs p-type semiconductor 20. Thus, instead of the p-metal layer 40 failing at an interface between the p-type semiconductor 20 and the p-metal 40, portions of the underlying p-type semiconductor 20 are removed. In contrast, FIG. 6 shows a plan view of similar semiconductor mesa structures 14 with deposited p-metal 28 omitting thin Pt layer 42. Without layer 42, some p-metal 28 is stripped away to reveal the interface (gray color) between the p-metal 28 and the underlying p-type semiconductor 20, i.e., the surface 26 of the p-type semiconductor 20. Consequently, the more conventional p-metal layer 28 is peeling from the semiconductor surface and failing before the stronger p-type semiconductor lattice 20 to which layer 28 should remain secured.

Figure 7:
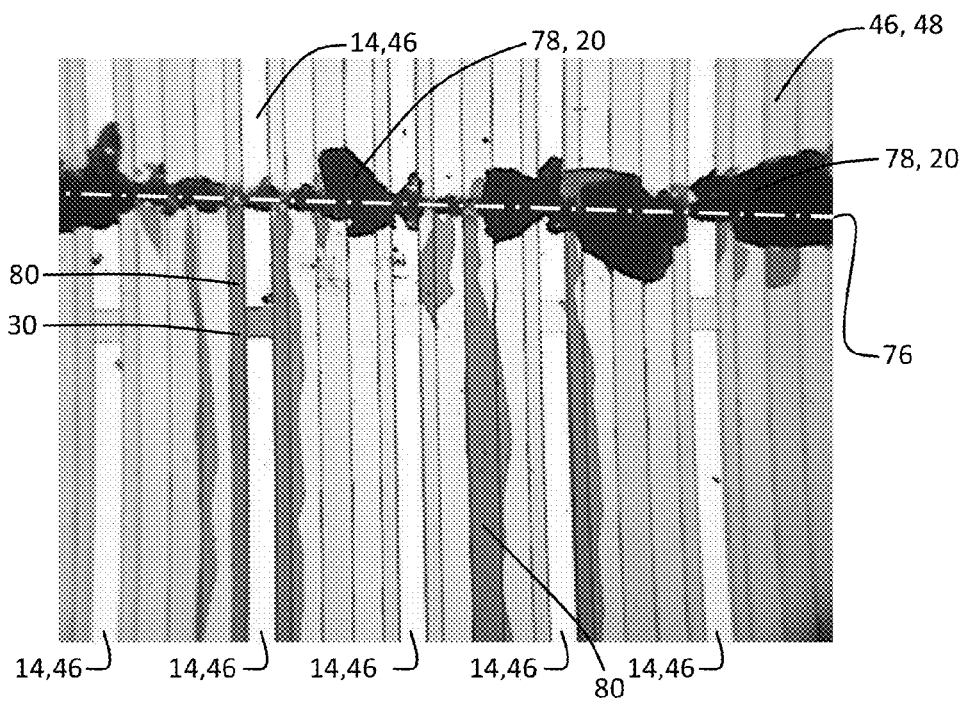
FIG. 7 is a plan view image of semiconductor devices after destructive testing.

When the thickness of Pt layer 42 is greater than 50 Å, the adhesion between the p-metal 46 and SiO2 is adversely affected. Similar destructive tests were used for such thicker Pt layers and the result is shown in FIG. 7. A line 76 was scribed across metalized mesa structures 14 (five shown) and top surface 48 was taped and peeled. Similar dark regions 78 reveal where p-metal was removed along with portions of underlying p-type semiconductor 20 in accordance with a preferred failure. However, also shown are gray regions 80 where the surface 30 of silicon oxide layer 22 was revealed. Hence, the Pt layer 42 thickness is up-limited by the adhesion between the Pt layer and silicon oxide.

Figure 8:
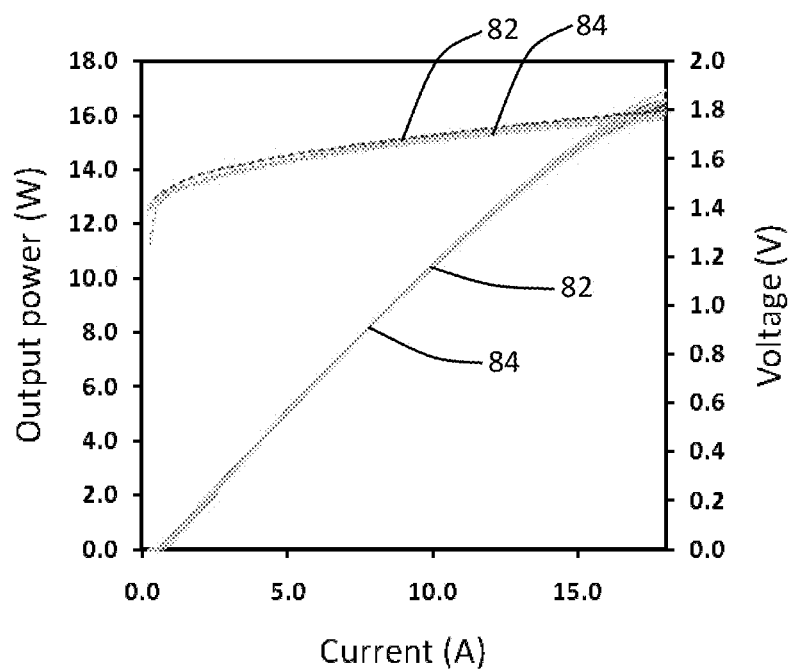
FIG. 8 is a chart of the L-I-V curves of both a typical p-metal layer and a layer utilizing an embodiment of the present invention.
Figure 9:
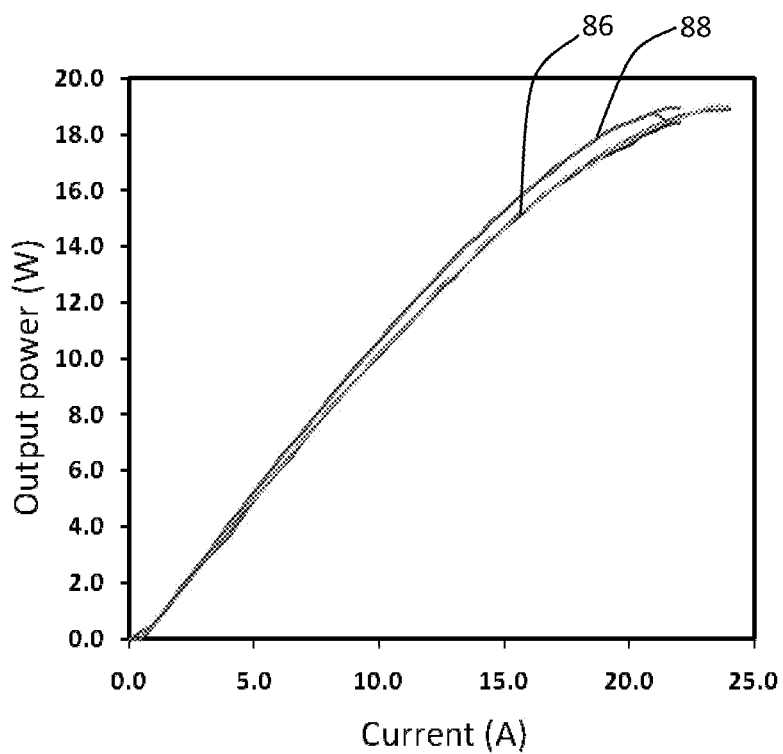
FIG. 9 is a chart of the L-I curves of catastrophic optical damage testing of both a typical p-metal layer and a layer utilizing an embodiment of the present invention.

After annealing processing step 58, thick gold is coated, such as by plating, as per step 60, over the metallization layer 40 typically to a thickness of a couple of μm. The structure 38 is lapped and polished, as per step 62, on the bottom end (not shown) in preparation for subsequent processing steps. An n-metal is typically deposited, as per step 64, on the underside 44 of the structure 10, 38 and the devices are cleaved, and if it is a laser, its facet is usually coated, as per step 66. The resulting devices may then be attached, as per step 68, to an additional substrate for further processing. There are various applications for a finished semiconductor device, including as a semiconductor laser. Performance characteristics of laser diodes made from semiconductor structures 38 utilizing the Pt layer 42 in the metallization layer 40 match or are very close to the characteristics of devices without the Pt layer 42. Shown in FIG. 8 are L-I-V curves 82 for laser diodes utilizing the Pt layer 42 as well as overlapping L-I-V curves 84 for laser diodes using a conventional Ti/Pt/Au layer 28. The results of catastrophic optical damage testing are shown in FIG. 9. As shown by comparison of curve 86 representing diode laser performance for devices using layer 42 and curve 88 representing diode laser performance for reference devices using a conventional metallization layer, minimal differences are observed. Thus, the overall performance of devices utilizing the Pt layer 42 demonstrate similar threshold current, slope, and burn-in stability as devices without the Pt layer.

However, devices such as laser diodes using layer 42 exhibit improved reliability over diodes that do not utilize layer 42 in Mil standard tests such as thermal cycling, shock, and vibration testing. After experiencing one hundred temperature cycles, vibration, and shock tests under Mil-Std-883, none of fifteen devices using Pt layer 42 shows degradation. For devices using conventional p-metal Ti/Pt/Au, one of fifteen failed after 38 temperature cycles, and five parts in fifteen showed increased thermal resistance. Moreover, with the addition of Pt layer 42, the failure rate experienced during later device fabrication is substantially reduced, such as during cleaving and coating process step 66 and die bonding process step 68.

It is thought that the present invention and many of the attendant advantages thereof will be understood from the foregoing description and it will be apparent that various changes may be made in the parts thereof without departing from the spirit and scope of the invention or sacrificing all of its material advantages, the forms hereinbefore described being merely exemplary embodiments thereof.

What is claimed is:

1. A semiconductor device comprising:
   a semiconductor substrate including a top epi layer having a surface with first and second portions;
   an insulating layer formed on said first portion and selectively removed from said second portion; and
   a metallization layer deposited on said insulating layer and said second portion, said metallization layer including a first layer made of Pt and having a thickness greater than 0 Å and less than or equal to 50 Å and a second layer made of a plurality of metallic sub-layers, wherein said first layer is in direct contact with said second portion and said insulating layer.

2. The device of claim 1, wherein said semiconductor substrate has one or more mesas defined on said surface and said second portion lies on said one or more mesas.

3. The device of claim 1, wherein said second layer includes sub-layers of Ti, Pt, and Au, respectively deposited on said first layer.

4. The device of claim 1, wherein said top epi layer is a p-type semiconductor made of GaAs or InP, and said metallization layer is a p-type metallization layer.

5. An semiconductor unit comprising:
   a semiconductor layer;
   a metallization layer; and
   a layer of Pt having a thickness of greater than 0 Å and less than or equal to 50 Å directly joining at least a portion of said semiconductor layer and at least a portion of said metallization layer;
   wherein said layer of Pt directly contacts an adjoining layer of silicon dioxide.

6. The semiconductor unit of claim 5, wherein said metallization layer is Ti/Pt/Au.

7. The semiconductor unit of claim 5, wherein said metallization layer comprises one or more electrode metals.

8. The semiconductor unit of claim 5, wherein said semiconductor layer is made of GaAs.

9. The semiconductor unit of claim 5, wherein said semiconductor layer is made of a III-V semiconductor.

* * * * *